US011733616B2

(12) United States Patent
Sasa et al.

(10) Patent No.: US 11,733,616 B2
(45) Date of Patent: Aug. 22, 2023

(54) SYSTEM FOR SUPPLYING PHOTORESIST AND METHOD FOR FABRICATING SEMICONDUCTOR DEVICE USING THE SAME

(71) Applicant: SAMSUNG ELECTRONICS CO., LTD., Suwon-si (KR)

(72) Inventors: Takashi Sasa, Hwaseong-si (KR); Kyoung Whan Oh, Hwaseong-si (KR); Sang Ho Lee, Suwon-si (KR); Seok Heo, Hwaseong-si (KR); Ho Kyun Kim, Hwaseong-si (KR); Ju Hyung Lee, Cheongju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/804,732

(22) Filed: May 31, 2022

(65) Prior Publication Data

US 2023/0115351 A1    Apr. 13, 2023

(30) Foreign Application Priority Data

Oct. 12, 2021 (KR) .................. 10-2021-0134815

(51) Int. Cl.
*G03F 7/20* (2006.01)
*G03F 7/00* (2006.01)

(52) U.S. Cl.
CPC .............. *G03F 7/70908* (2013.01)

(58) Field of Classification Search
CPC ........ G03F 7/70908; G03F 7/16; G03F 7/162; B05B 12/006; B05B 7/26; B05C 11/1013; B05C 11/1002
See application file for complete search history.

(56) References Cited

U.S. PATENT DOCUMENTS 7,685,963 B2 *  3/2010  Lee ...................... G03F 7/016
                                                   118/694
10,518,199 B2  12/2019  Sasa et al.
10,807,027 B2  10/2020  Ichino et al.
(Continued)

FOREIGN PATENT DOCUMENTS

JP    2007-303402    11/2007
JP    2009-047090     3/2009
(Continued)

*Primary Examiner* — Peter B Kim
(74) *Attorney, Agent, or Firm* — F. Chau & Associates, LLC

(57) ABSTRACT

A photoresist supplying system includes a pump that includes a first tube phragm that stores a photoresist and a filter that filters the photoresist, a second tube phragm that stores the photoresist and is disposed outside the pump, where the second tube phragm transfers the photoresist to the first tube phragm, a storage unit that stores the photoresist, where the storage unit provides the photoresist to the second tube phragm, and a tube phragm drive unit that is connected to the first tube phragm. The tube phragm drive unit adjusts an interior volume of the first tube phragm and applies a pressure to a flexible outer wall of the first tube phragm to transfer the photoresist from the first tube phragm to a nozzle installed in the chamber. At least a part of the photoresist stored in the first tube phragm is transferred to the second tube phragm.

18 Claims, 21 Drawing Sheets

(56) References Cited

U.S. PATENT DOCUMENTS

2015/0328649 A1* 11/2015 Carcasi ..................... G03F 7/16
                                                    222/134
2019/0076763 A1*  3/2019 Ichino ................. G03F 7/70875
2020/0256330 A1   8/2020 Ishimaru et al.
2021/0008588 A1*  1/2021 Ide ..................... B05C 11/1002

FOREIGN PATENT DOCUMENTS

| KR | 10-1999-0058611 | 7/1999 |
| KR | 10-1999-0065029 | 8/1999 |
| KR | 10-2000-0071774 | 11/2000 |
| KR | 10-2012-0133226 | 12/2012 |
| KR | 10-2012-0133227 | 12/2012 |
| KR | 10-2020-0105401 | 9/2020 |

* cited by examiner

SYSTEM FOR SUPPLYING PHOTORESIST AND METHOD FOR FABRICATING SEMICONDUCTOR DEVICE USING THE SAME

CROSS-REFERENCE TO RELATED APPLICATION

This application claims priority under 35 U.S.C. 119 from Korean Patent Application No. 10-2021-0134815, filed on Oct. 12, 2021 in the Korean Intellectual Property Office, the contents of which are herein incorporated by reference in their entirety.

1. TECHNICAL FIELD

Embodiments of the present disclosure are directed to a system that supplies a photoresist and a method for fabricating a semiconductor device using the same.

2. DISCUSSION OF THE RELATED ART

Photo track equipment coats a photosensitive liquid called a photoresist onto a wafer to perform a process. The cleanliness of the photoresist a required characteristic in the photo track equipment. Particles and bubbles may be generated by a driving a pump of the photo track equipment, and a process efficiency of the photo track equipment can be degraded due to such particles and bubbles.

SUMMARY

Embodiments of the present disclosure provide a photoresist supplying system that removes particles and bubbles generated inside the pump, and a method for fabricating a semiconductor device using the same.

Embodiments of the present disclosure also provide a photoresist supplying system that reduces the amount of bubbles generated inside the pipe by maintaining constant the internal pressure of the pipe, using a pressure sensor disposed inside the pump, and a method for fabricating a semiconductor device using the same.

According to an exemplary embodiment of the present disclosure, there is provided a method for fabricating a semiconductor device, comprising loading a wafer into a chamber, discharging a photoresist onto the wafer using a photoresist supplying system, forming a photoresist pattern on the wafer using the photoresist, and unloading the wafer from the chamber. The photoresist supplying system includes a pump that includes a first tube phragm that stores the photoresist and a filter that filters the photoresist, a second tube phragm that stores the photoresist, where the second tube phragm is disposed outside the pump and transfers the photoresist to the first tube phragm, a storage unit that stores the photoresist and provides the photoresist to the second tube phragm, and a tube phragm drive unit that is connected to the first tube phragm. The tube phragm drive unit controls the first tube phragm and the first tube phragm transfers the photoresist to a nozzle installed in the chamber. At least a part of the photoresist stored in the first tube phragm is transferred to the second tube phragm.

According to an exemplary embodiment of the present disclosure, there is provided a system for supplying a photoresist, comprising a pump that includes a first tube phragm that storing a photoresist and a filter that filters the photoresist, a second tube phragm that stores the photoresist, where the second tube phragm is disposed outside the pump and transfers the photoresist to the first tube phragm, a storage unit that stores the photoresist and provides the photoresist to the second tube phragm, and a tube phragm drive unit that is connected to the first tube phragm. The tube phragm drive unit adjusts an interior volume of the first tube phragm and applies a pressure to a flexible outer wall of the first tube phragm to transfer the photoresist stored in the first tube phragm to a nozzle installed in the chamber. At least a part of the photoresist stored in the first tube phragm is transferred to the second tube phragm.

According to an exemplary embodiment of the present disclosure, there is provided a system for supplying a photoresist, comprising a pump that includes a first tube phragm that stores the photoresist and a filter that filters the photoresist, a second tube phragm that stores the photoresist, where the second tube phragm is disposed outside the pump and transfers the photoresist to the first tube phragm, a storage unit that stores the photoresist and provides the photoresist to the second tube phragm, a tube phragm drive unit that is connected to the first tube phragm, where the tube phragm drive unit adjusts an interior volume of the first tube phragm, a first pipe that is connected to one end of the filter, a second pipe that is connected to an other end of the filter, a third pipe that is connected to the filter and extends out from the pump, a first pressure sensor disposed in the first pipe, a second pressure sensor disposed in the second pipe, and a control unit that acquires information about a first pressure of the first pipe from the first pressure sensor and information about a second pressure of the second pipe from the second pressure sensor, the control unit controls the tube phragm drive unit using the information about the first pressure and the information about the second pressure. When a differential pressure between the first pressure and the second pressure reaches a preset differential pressure, the control unit controls the tube phragm drive unit and the photoresist is transferred from the first tube phragm to the filter, and the control unit discharges particles and bubbles present inside the filter out from the pump through the third pipe using the photoresist received from the first tube phragm.

According to an exemplary embodiment of the present disclosure, there is provided a system for supplying a photoresist, comprising a pump that includes a first tube phragm that stores the photoresist and a filter that filters the photoresist, a second tube phragm that stores the photoresist, wherein the second tube phragm is disposed outside the pump and provides the photoresist to the first tube phragm, and a storage unit that stores the photoresist and provides the photoresist to the second tube phragm. The photoresist is transferred from the first tube phragm to a nozzle installed in a chamber. At least a part of the photoresist stored in the first tube phragm is transferred to the second tube phragm. Transferring the photoresist from the first tube phragm to the nozzle includes a first step of transferring the photoresist from the first tube phragm to the nozzle without filtering, a second step of filtering the photoresist stored in the second tube phragm using the filter and transferring the photoresist to the first tube phragm, a third step of transferring the photoresist from the first tube phragm to the second tube phragm without filtering, a fourth step of transferring the photoresist from the first tube phragm to the filter wherein particles and bubbles present inside the filter are discharged out from the pump, a fifth step of adjusting an interior volume of the first tube phragm wherein an internal pressure of a pipe is adjusted, and a sixth step of transferring the photoresist from the storage unit to the second tube phragm.

The first to sixth steps are repeatedly performed wherein the photoresist is transferred to the nozzle.

DETAILED DESCRIPTION

Hereinafter, a photoresist supplying system according to some embodiments of the present disclosure will be described with reference to the figures.

Figure 1:
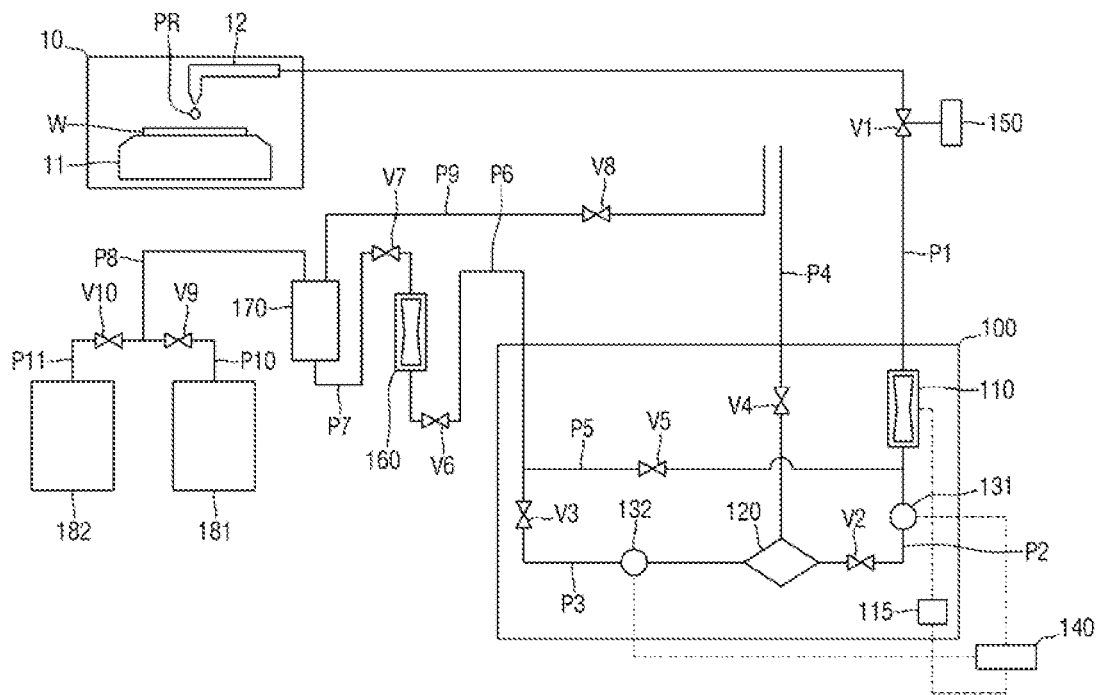
FIG. 1 illustrates a photoresist supplying system according to some embodiments of the present disclosure.

FIG. 1 illustrates a photoresist supplying system according to some embodiments of the present disclosure.

Referring to FIG. 1, a photoresist supplying system according to some embodiments of the present disclosure includes a first tube phragm 110, a tube phragm drive unit 115, a filter 120, a first pressure sensor 131, a second pressure sensor 132, a first control unit 140, a second control unit 150, a second tube phragm 160, an auxiliary storage unit 170, a first storage unit 181, a second storage unit 182, first to eleventh pipes P1 to P11, and first to tenth valves V1 to V10.

The photoresist supplying system provides a photoresist PR to a nozzle 12 disposed in a chamber 10. A wafer W may be loaded onto a stage 11 disposed inside the chamber 10. The photoresist PR provided to the nozzle 12 is discharged to the top of the wafer W onto the stage 11. A photoresist pattern may be formed on the wafer W using the photoresist PR.

A pump 100 includes the first tube phragm 110, the tube phragm drive unit 115, the filter 120, the first pressure sensor 131, the second pressure sensor 132, the first control unit 140, the second control unit 150, the first to sixth pipes P1 to P6, and the first to sixth valves V1 to V6.

The first tube phragm 110 is disposed inside the pump 100. The photoresist PR is stored inside the first tube phragm 110. An outer wall of the first tube phragm 110 is formed of a flexible material. Because the outer wall of the first tube phragm 110 is formed of a flexible material, the generation of bubbles inside the first tube phragm 110 can be reduced.

The tube phragm drive unit 115 is connected to the first tube phragm 110. The tube phragm drive unit 115 applies pressure to the outer wall of the first tube phragm 110 to reduce an internal volume of the first tube phragm 110. As a result, the photoresist PR stored inside the first tube phragm 110 is discharged out of the first tube phragm 110. The tube phragm drive unit 115 is controlled by the first control unit 140.

A first pipe P1 is connected between the pump 100 and the nozzle 12. For example, the first pipe P1 is connected between one end of the first tube phragm 110 and the nozzle 12. The photoresist PR is transferred from the first tube phragm 110 through the first pipe P1 to the nozzle 12. The first valve V1 is installed in the first pipe P1. The first valve V1 can adjust an amount of the photoresist PR flowing through the first pipe P1.

The second control unit 150 controls the first valve V1 to adjust the amount of the photoresist PR flowing through the first pipe P1. The second control unit 150 controls the internal pressure of the first pipe P1 by adjusting the amount of the photoresist PR flowing through the first pipe P1 depending on a vertical position of the nozzle 12.

The filter 120 is disposed inside the pump 100. The filter 120 filter particles and bubbles present in the photoresist PR. A second pipe P2 is connected between the other end of the first tube phragm 110 and one end of the filter 120. The second valve V2 is installed in the second pipe P2. The second valve V2 adjusts the amount of the photoresist PR flowing through the second pipe P2.

A third pipe P3 is connected to the other end of the filter 120. The third valve V3 is installed in the third pipe P3. The third valve V3 adjusts the amount of the photoresist PR flowing through the third pipe P3. A fourth pipe P4 is connected to the filter 120. The fourth pipe P4 extends out from the pump 100. The fourth pipe P4 functions as a drain pipe. The fourth valve V4 is installed in the fourth pipe P4. The fourth valve V4 adjusts the amount of the photoresist PR flowing through the fourth pipe P4.

A fifth pipe P5 is connected between the second pipe P2 and the third pipe P3. The fifth valve V5 is installed in the fifth pipe P5. The fifth valve V5 adjusts the amount of the photoresist PR flowing through the fifth pipe P5. A sixth pipe P6 is connected to each of the third pipe P3 and the fifth pipe P5. The sixth pipe P6 extends out from the pump 100 and is connected to the second tube phragm 160. For example, the sixth pipe P6 is connected between the third pipe P3 and the second tube phragm 160. Further, the sixth pipe P6 is connected between the fifth pipe P5 and the second tube phragm 160. A sixth valve V6 is installed in the sixth pipe P6. The sixth valve V6 adjusts the amount of the photoresist PR flowing through the sixth pipe P6.

The first pressure sensor 131 is disposed in the second pipe P2. For example, the first pressure sensor 131 is disposed between the other end of the first tube phragm 110 and the second valve V2. The first pressure sensor 131 measures a first pressure of the second pipe P2. The first control unit 140 acquires information about the first pressure of the second pipe P2 from the first pressure sensor 131.

The second pressure sensor 132 is disposed in the third pipe P3. For example, the second pressure sensor 132 is disposed between the other end of the filter 120 and the third valve V3. The second pressure sensor 132 measures a second pressure of the third pipe P3. The first control unit 140 acquires information about the second pressure of the third pipe P3 from the second pressure sensor 132.

The first control unit 140 acquires information on the first pressure of the second pipe P2 from the first pressure sensor 131 and information on the second pressure of the third pipe P3 from the second pressure sensor 132. The first control unit 140 controls the tube phragm drive unit 115 using the information about the first pressure and the information about the second pressure.

The first control unit 140 controls the first tube phragm 110 to transfer the photoresist PR stored therein to the filter 120, using the tube phragm drive unit 115. The phragm drive unit 115 uses the photoresist PR in the filter 120 to discharge the particles and bubbles present inside the filter 120 out of the pump 100 through the fourth pipe P4. A detailed explanation thereof will be provided below.

The first control unit 140 controls the first tube phragm 110 to output the photoresist PR stored therein through second pipe P2 using the first pressure information from the first pressure sensor 131, thereby increasing the internal pressure of the second pipe P2. The first control unit 140 adjusts the internal pressure of the second pipe P2 to be constant through such an operation. A detailed explanation thereof will be provided below.

The second tube phragm 160 is disposed outside the pump 100. One end of the second tube phragm 160 is connected to the sixth pipe P6. The photoresist PR is stored inside the second tube phragm 160. The outer wall of the second tube phragm 160 is made of a flexible material. In addition, another tube phragm drive unit may be provided that applies pressure to the outer wall of the second tube phragm 160. As the volume of the second tube phragm 160 decreases, the photoresist PR stored inside the second tube phragm 160 is discharged out from the second tube phragm 160.

The second tube phragm 160 transfers the photoresist PR from the storage units to the first tube phragm 110. Further, at least a part of the photoresist PR stored in the first tube phragm 110 is transferred in a reverse direction to the second tube phragm 160. A detailed explanation thereof will be provided below.

The auxiliary storage unit 170 is disposed outside the pump 100. The photoresist PR can be stored inside the auxiliary storage unit 170. When the first storage unit 181 and the second storage unit 182 are replaced, the auxiliary storage unit 170 can store and provide the photoresist PR to prevent the process from being interrupted.

A seventh pipe P7 connects one end of the auxiliary storage unit 170 and the other end of the second tube phragm 160. The photoresist PR stored in the auxiliary storage unit 170 is transferred to the second tube phragm 160 through the seventh pipe P7. The seventh valve V7 is installed in the seventh pipe P7. The seventh valve V7 adjusts the amount of the photoresist PR flowing through the seventh pipe P7.

An eighth pipe P8 is connected to the other end of the auxiliary storage unit 170. The ninth pipe P9 is connected to the auxiliary storage unit 170. The ninth pipe P9 functions as a drain pipe. The eighth valve V8 is installed in the ninth pipe P9. The eighth valve V8 adjusts the amount of the photoresist PR flowing through the ninth pipe P9.

Each of the first storage unit 181 and the second storage unit 182 is disposed outside the pump 100. The photoresist PR is stored in each of the first storage unit 181 and the second storage unit 182. Although two storage units are shown to be disposed in FIG. 1, embodiments of the present disclosure are not necessarily limited thereto.

Each of the first storage unit 181 and the second storage unit 182 can provide the photoresist PR to the auxiliary storage unit 170. For example, each of the first storage unit 181 and the second storage unit 182 can provide the photoresist PR through the auxiliary storage unit 170 to the second tube phragm 160. For example, when one of the first storage unit 181 or the second storage unit 182 provides the photoresist PR to the auxiliary storage unit 170, the other of the first storage unit 181 and the second storage unit 182 does not provide the photoresist PR to the auxiliary storage unit 170.

A tenth pipe P10 connects the eighth pipe P8 and the first storage unit 181. A ninth valve V9 is installed in the tenth pipe P10. The ninth valve V9 adjusts the amount of the photoresist PR flowing through the tenth pipe P10. An eleventh pipe P11 is connected between the eighth pipe P8 and the second storage unit 182. The tenth valve V10 is installed in the eleventh pipe P11. The tenth valve V10 adjusts the amount of the photoresist PR flowing through the eleventh pipe P11.

Hereinafter, a method for fabricating a semiconductor device using a photoresist supplying system according to some embodiments of the present disclosure will be described referring to FIGS. 1 and 2.

Figure 2:
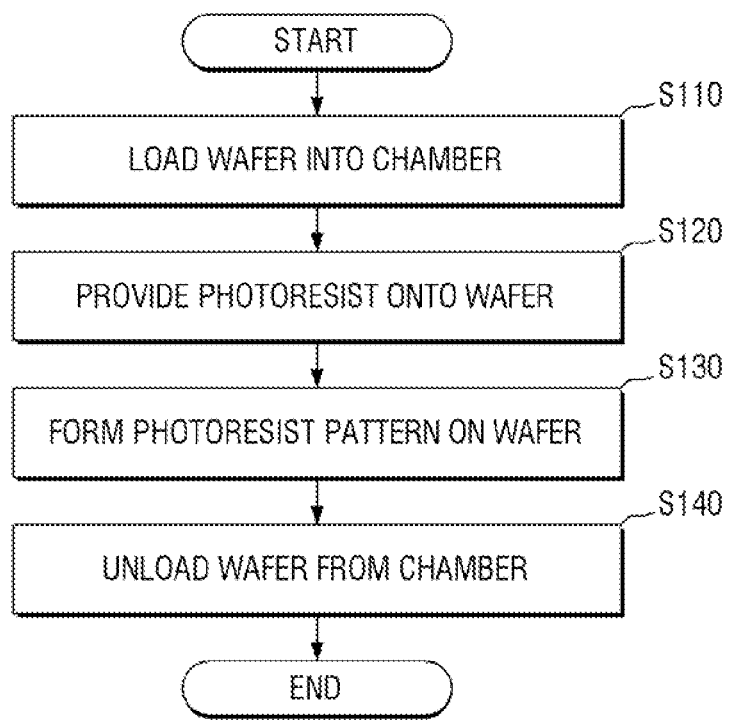
FIG. 2 is a flowchart of a method for fabricating a semiconductor device using a photoresist supplying system according to some embodiments of the present disclosure.

FIG. 2 is a flowchart of a method for fabricating a semiconductor device using a photoresist supplying system according to some embodiments of the present disclosure.

Referring to FIGS. 1 and 2, in an embodiment, a wafer W is loaded into the chamber 10 (S110). The wafer W is loaded onto the stage 11 disposed inside the chamber 10.

The photoresist PR is discharged onto the top of the wafer W (S120). The photoresist PR is transferred to the nozzle 12 by a photoresist supplying system shown in FIG. 1. The photoresist PR transferred to the nozzle 12 is applied onto the top of the wafer W. For example, the photoresist PR is applied onto the top of a rotating wafer W.

A photoresist pattern is formed on the wafer W (S130). For example, the state of the applied photoresist PR can be changed by subjecting the wafer W with the photoresist PR to a baking process. An exposure process and a developing process are performed to form a photoresist pattern on the wafer W. The wafer W on which the photoresist pattern is formed is unloaded from the chamber 10 (S140).

Hereinafter, a method for operating a photoresist supplying system according to some embodiments of the present disclosure will be described referring to FIGS. 3 to 9.

Figure 3:
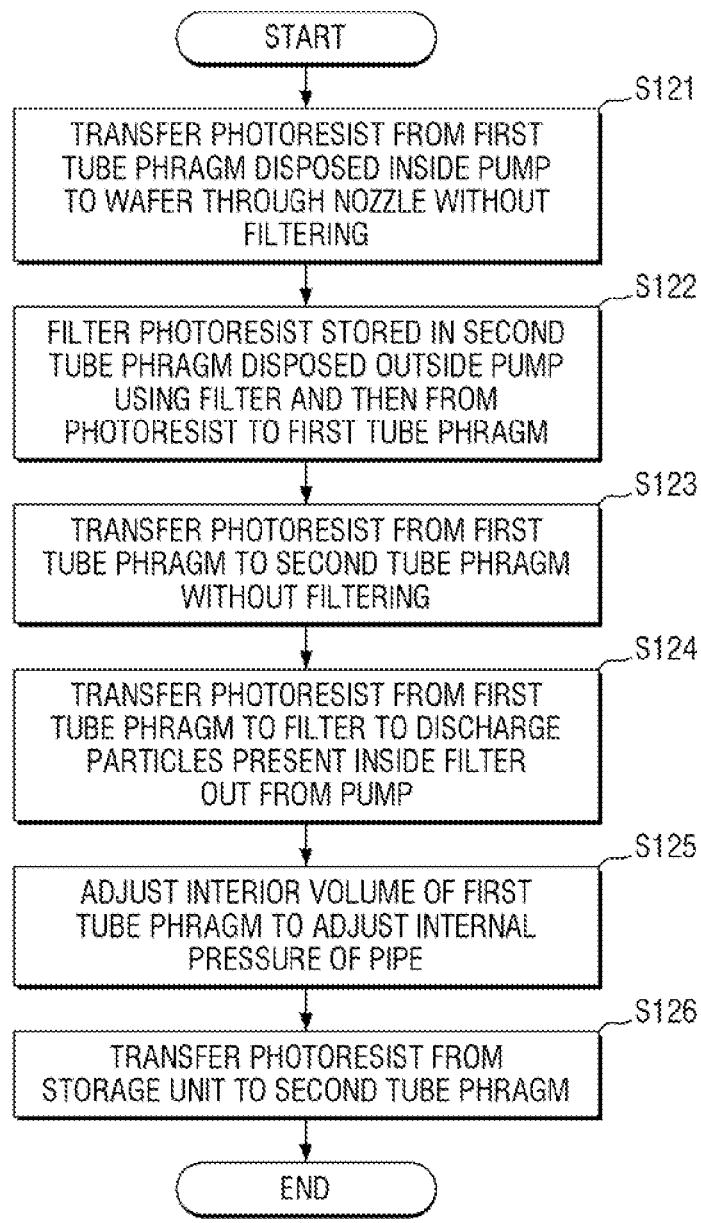
FIG. 3 is a flowchart of a method for operating a photoresist supplying system according to some embodiments of the present disclosure.

FIG. 3 is a flowchart of a method for operating a photoresist supplying system according to some embodiments of the present disclosure. FIG. 3 is a detailed flowchart of step S120 of providing the photoresist PR to the top of the wafer W shown in FIG. 2. FIGS. 4 to 9 illustrate a method for operating a photoresist supplying system according to some embodiments of the present disclosure.

Figure 4:
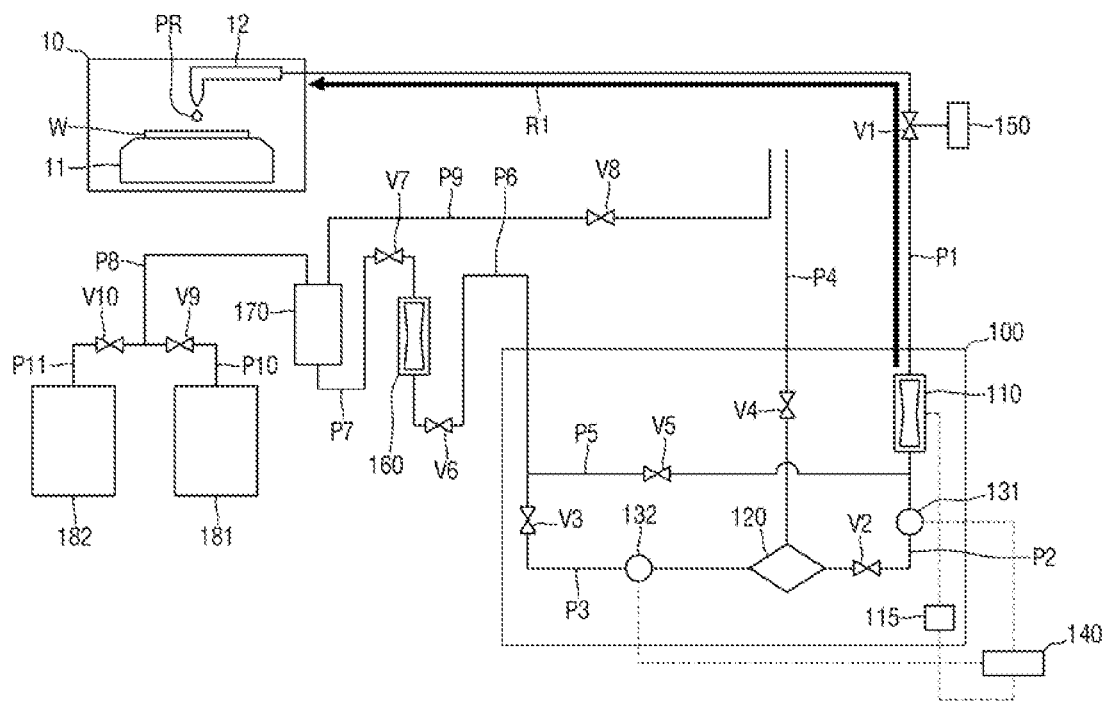
FIGS. 4 to 9 illustrate a method for operating a photoresist supplying system according to some embodiments of the present disclosure.

Referring to FIGS. 3 and 4, in an embodiment, in a step S121, the photoresist PR stored in the first tube phragm 110 is discharged to the wafer W through the nozzle 12 without filtering.

Specifically, when the first valve V1 is opened and each of the second to sixth valves V2 to V6 is closed, the photoresist PR stored in the first tube phragm 110 flows through the first pipe P1 along a first route R1 to the nozzle 12. The first route R1 does not pass through the filter 120.

For example, before the photoresist PR stored in the first tube phragm 110 is transferred to the nozzle 12, the interior of the first tube phragm 110 contracts to push the photoresist PR from the first tube phragm 110 into the first pipe P1. Further, the interior of the first tube phragm 110 expands to pull the photoresist PR from the first pipe P1 into the first tube phragm 110. The expansion and contraction of the interior of the first tube phragm 110 is repeatedly performed. The amount of the photoresist PR flowing between the first tube phragm 110 and the first pipe P1 is so small that the photoresist PR is not discharged from the nozzle 12 onto the wafer W.

Through the repeated operation of expansion and contraction of the interior of the first tube phragm 110, the photoresist PR inside the first pipe P1 connected to the nozzle 12 is prevented from staying at a same position. As a result, particles generated by the photoresist PR are suppressed from staying inside the first pipe P1.

Figure 5:
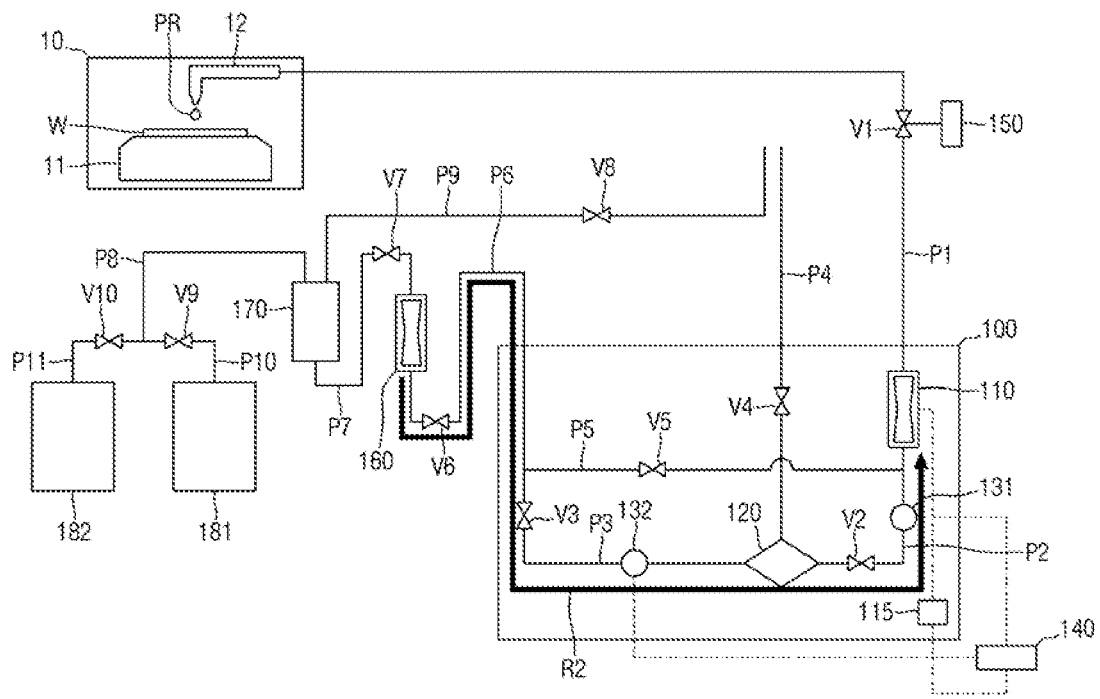

Referring to FIGS. 3 and 5, in an embodiment, in a step S122, the photoresist PR stored in the second tube phragm 160 is filtered using the filter 120, and is transferred to the first tube phragm 110.

Specifically, when each of the second valve V2, the third valve V3, and the sixth valve V6 is opened, and each of the first valve V1, the fourth valve V4, the fifth valve V5, and the seventh valve V7 is closed, the photoresist PR stored in the second tube phragm 160 sequentially flows through the sixth pipe P6, the third pipe P3, the filter 120 and the second pipe P2 along the second route R2 to the first tube phragm 110.

Figure 6:
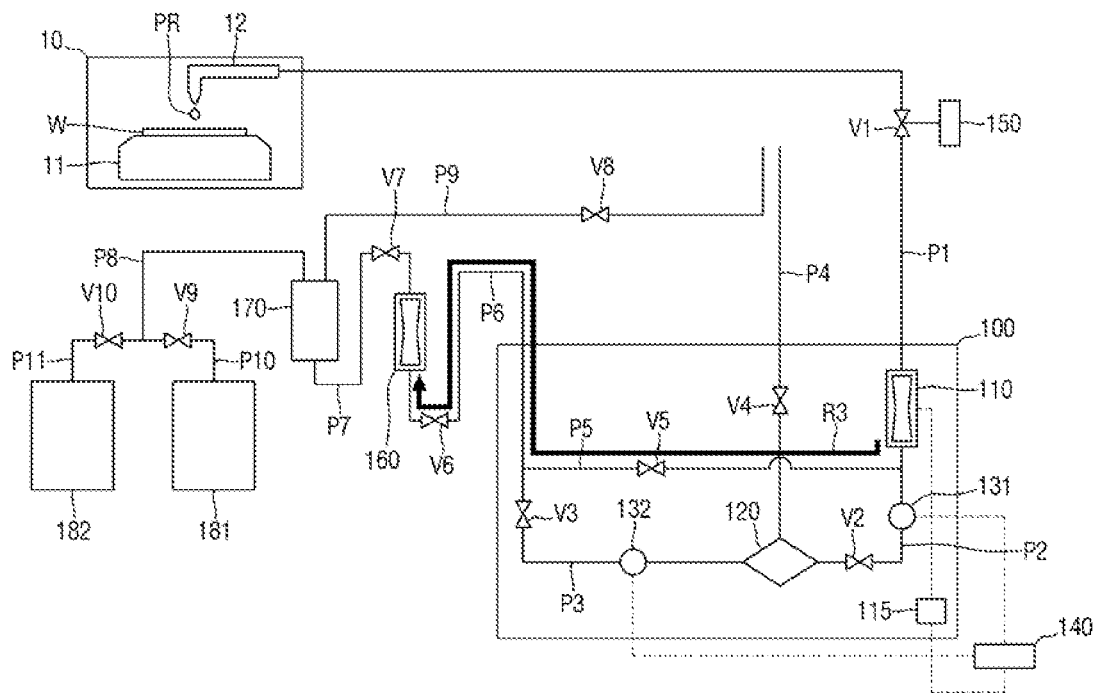

Referring to FIGS. 3 and 6, in an embodiment, in a step S123, at least a part of the photoresist PR stored in the first tube phragm 110 is transferred to the second tube phragm 160 without filtering. That is, a recirculation operation is performed that transfers at least a part of the photoresist PR from the first tube phragm 110 to the second tube phragm 160.

Specifically, when each of the fifth valve V5 and the sixth valve V6 is opened and each of the first to fourth valves V1 to V4 is closed, the photoresist PR stored in the first tube phragm 110 sequentially flows through the fifth pipe P5 and the sixth pipe P6 along the third route R3 to the second tube phragm 160.

A length of the pipe from the first storage unit 181 to the second tube phragm 160 is greater than a length of the pipe from the second tube phragm 160 to the first tube phragm 110. A photoresist supplying system according to some embodiments of the present disclosure reduces the length of the pipe through which the photoresist PR flows when replenishing the second tube phragm 160 with the photoresist PR, through the recirculation operation that transfers at least a part of the photoconductor PR from in the first tube phragm 110 to the second tube phragm 160. Therefore, by shortening the time for the photoresist PR to stay inside the pipe, the generation of particles having gel characteristics inside the pipe is suppressed.

Figure 7:
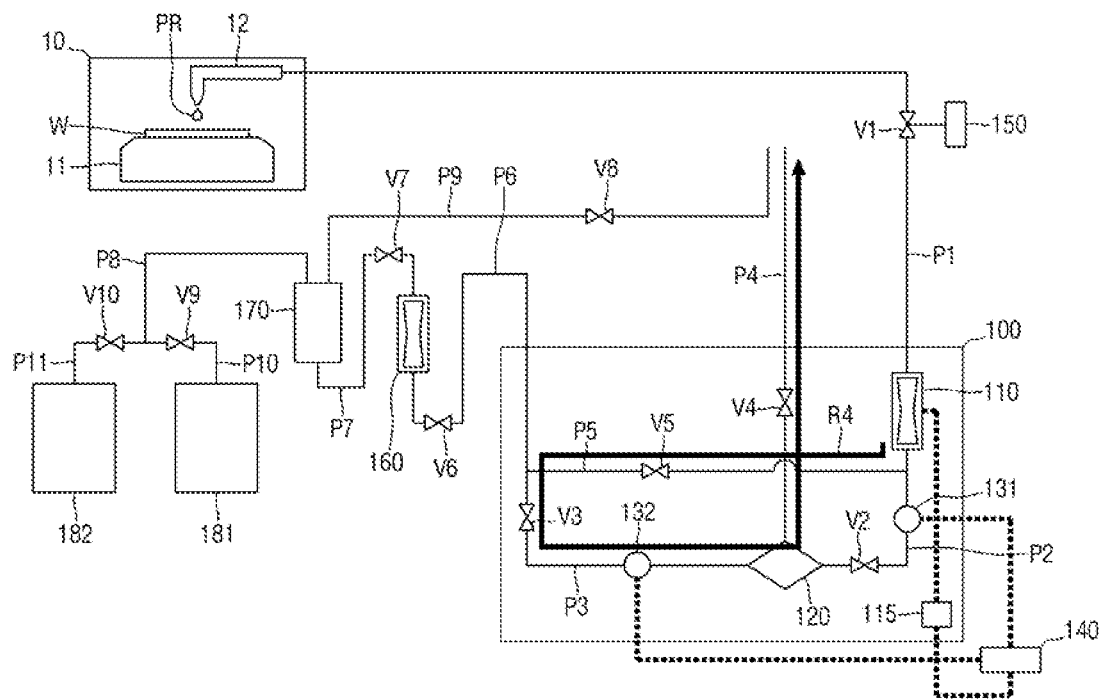

Referring to FIGS. 3 and 7, in an embodiment, in a step S124, the photoresist PR stored in the first tube phragm 110 flows to the filter 120, and the particles and bubbles present inside the filter 120 are discharged out from the pump 100.

Specifically, when each of the third to fifth valves V3 to V5 is opened and each of the first valve V1, the second valve V2 and the sixth valve V6 is closed, the photoresist PR stored in the first tube phragm 110 sequentially flows through the fifth pipe P5, the third pipe P3, the filter 120 and the fourth pipe P4 along the fourth route R4 out from the pump 100. The photoresist PR is discharged out from the pump 100, together with particles and bubbles present inside the filter 120.

The first control unit 140 acquires information on the first pressure of the second pipe P2 from the first pressure sensor 131 and information on the second pressure of the third pipe P3 from second pressure sensor 132. When a differential pressure between the first pressure and the second pressure reaches a preset differential pressure, the first control unit 140 controls the tube phragm drive unit 115 to transfer the photoresist PR from the first tube phragm 110 to the filter 120. The photoresist PR transferred to the filter 120 is discharged out from the pump 100, together with particles and bubbles present inside the filter 120.

After the particles and bubbles existing inside the filter 120 are discharged out from the pump 100 through the fourth pipe P4 and the differential pressure between the first pressure and the second pressure is maintained at or above the preset differential pressure, the filter 120 can be replaced.

A photoresist supplying system according to some embodiments of the present disclosure increases the function of the filter 120, by discharging the particles and bubbles present in the filter 120 out from the pump 100, using the two pressure sensors 131 and 132 disposed on both sides of the filter 120. Further, a photoresist supplying system according to some embodiments of the present disclosure checks the status of the filter 120 using the two pressure sensors 131 and 132 to determine whether to replace the filter 120.

Figure 8:
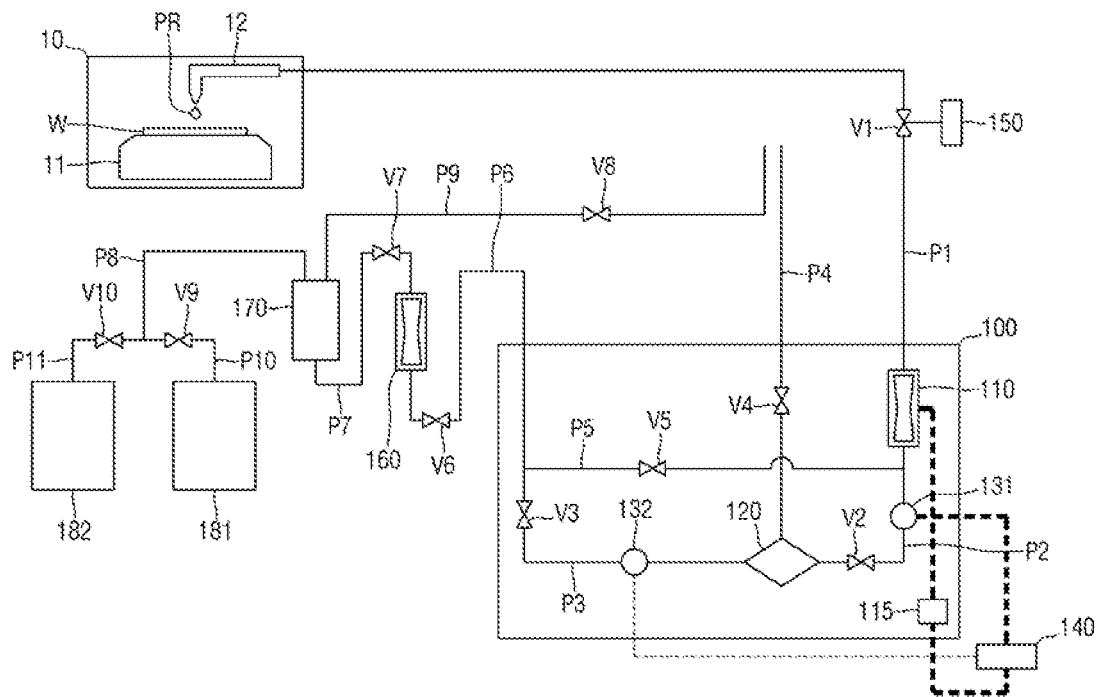

Referring to FIGS. 3 and 8, in an embodiment, in a step S125, the interior volume of the first tube phragm 110 is adjusted to adjust the pressure of the second pipe P2.

Specifically, when the first pressure of the second pipe P2 drops below a preset pressure, the first control unit 140 controls the tube phragm drive unit 115 to transfer the photoresist PR from the first tube phragm 110 to the second pipe P2. Accordingly, the internal pressure of the second pipe P2 is increased, and the first pressure inside the second pipe P2 is maintained higher than the preset pressure.

A photoresist supplying system according to some embodiments of the present disclosure reduces the amount of bubbles generated inside the pipe, by maintaining the pressure of the pipe constant, using the pressure sensor.

Figure 9:
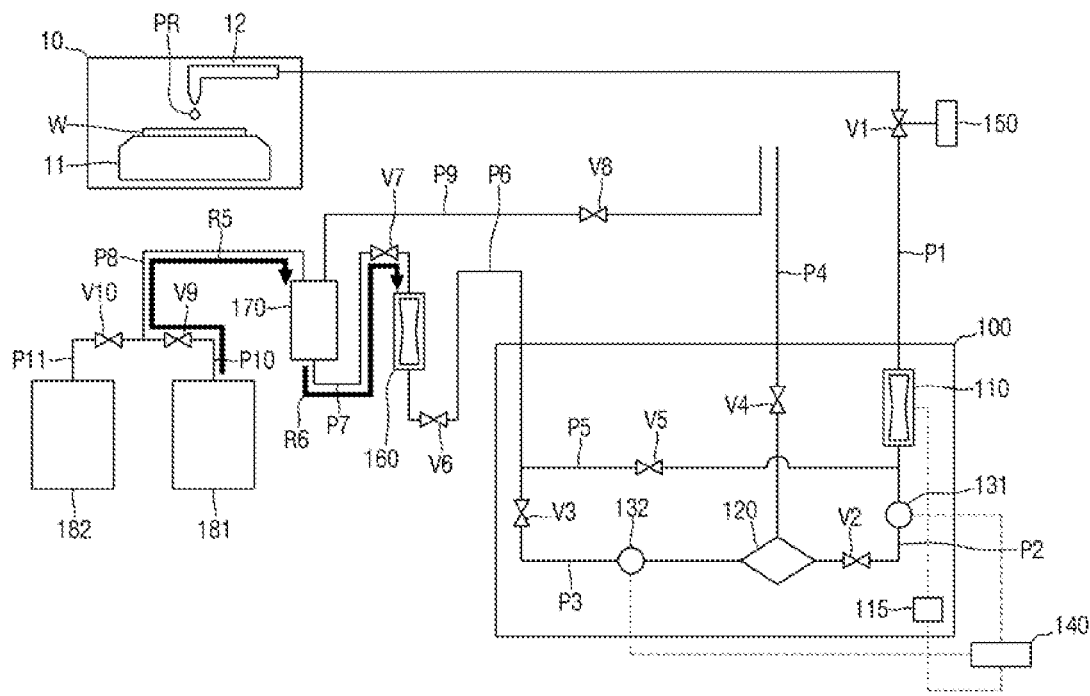

Referring to FIGS. 3 and 9, in an embodiment, in a step S126, the photoresist PR stored in the first storage unit 181 or the second storage unit 182 is transferred to the second tube phragm 160.

For example, when the photoresist PR stored in the first storage unit 181 is transferred to the second tube phragm 160, when each of the seventh valve V7 and the ninth valve V9 is opened and each of the sixth valve V6, the eighth valve V8 and the tenth valve V10 is closed, the photoresist PR stored in the first storage unit 181 sequentially flows through the tenth pipe P10 and the eighth pipe P8 along the fifth route R5 to the auxiliary storage unit 170. Subsequently, the photoresist PR stored in the auxiliary storage unit 170 flows through the seventh pipe P7 along the sixth route R6 to the second tube phragm 160.

After the photoresist PR stored in the first storage unit 181 is transferred to the second tube phragm 160, the eighth valve V8 is selectively opened, and air present inside the auxiliary storage unit 170 is discharged out from the auxiliary storage unit 170 through the ninth pipe P9.

A photoresist supplying system according to some embodiments of the present disclosure provides the photoresist PR to the nozzle 12, by repeatedly performing steps S121 to S126 shown in FIG. 3.

Hereinafter, a method for operating a photoresist supplying system according to some embodiments of the present disclosure will be described referring to FIG. 10. Differences from a method for operating a photoresist supplying system shown in FIGS. 3 to 9 will be mainly described.

Figure 10:
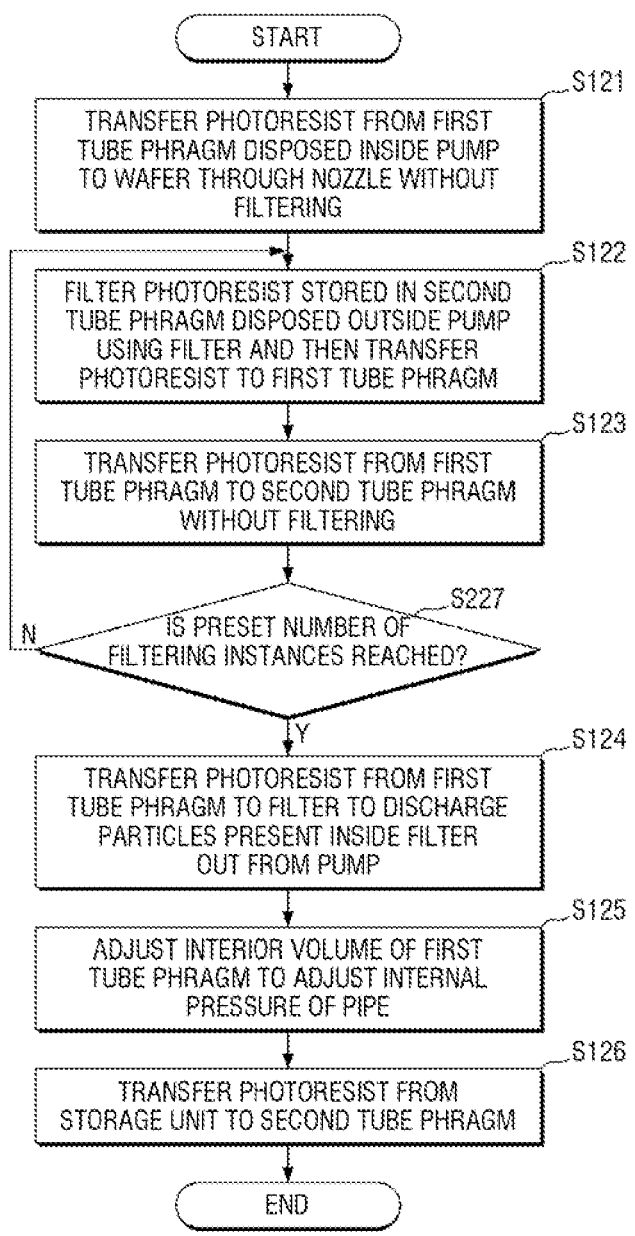
FIG. 10 is a flowchart of a method for operating a photoresist supplying system according to some embodiments of the present disclosure.

FIG. 10 is a flowchart of a method for operating a photoresist supplying system according to some embodiments of the present disclosure. FIG. 10 is a detailed flowchart of step S120 of providing the photoresist PR to the top of the wafer W shown in FIG. 2.

Referring to FIG. 10, in an embodiment, a method for operating a photoresist supplying system according to some embodiments of the present disclosure determines in step S227 whether a preset number of filtering instances has been reached after step S123 is completed.

When the number of filtering instances reaches the preset number of filtering instances, step S124 is performed. However, until the number of filtering instances reaches the preset number of filtering instances, the second step S122 and the third step S123 are repeatedly performed again. That is, the second step S122 and the third step S123 are repeatedly performed until the number of filtering instances reaches a preset number of filtering instances.

Hereinafter, a photoresist supplying system according to some embodiments of the present disclosure will be described referring to FIG. 11. Differences from a photoresist supplying system shown in FIG. 1 will be mainly described.

Figure 11:
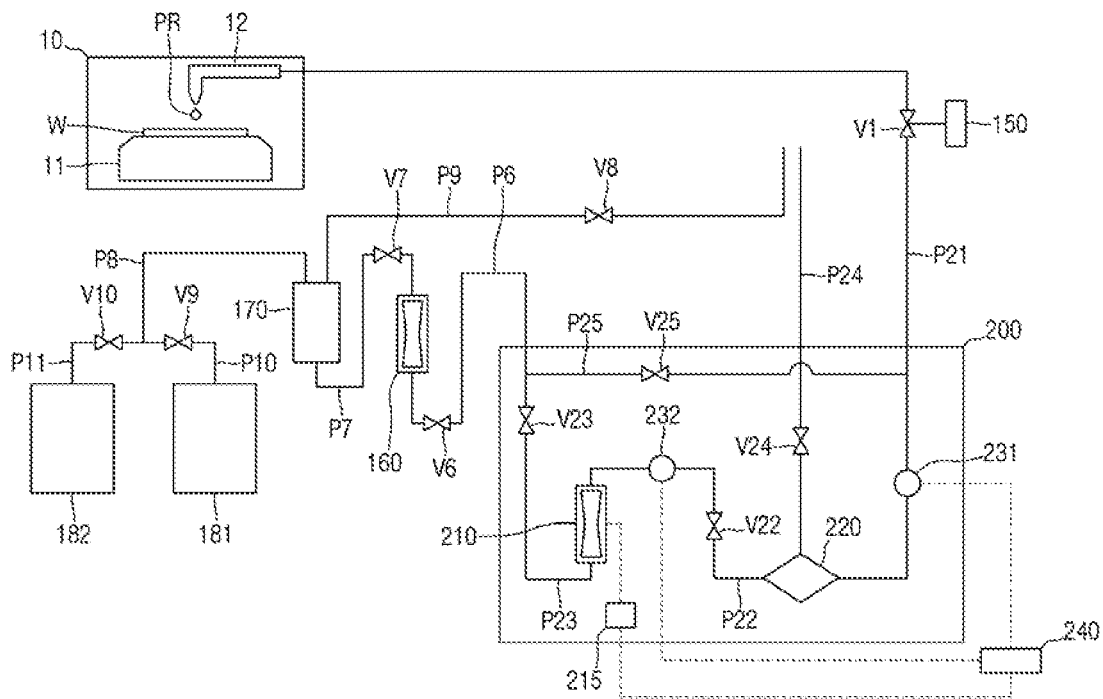
FIG. 11 illustrates a photoresist supplying system according to some embodiments of the present disclosure.

FIG. 11 illustrates a photoresist supplying system according to some embodiments of the present disclosure.

Referring to FIG. 11, in a photoresist supplying system according to some embodiments of the present disclosure, a pump 200 includes a first tube phragm 210, a tube phragm drive unit 215, a filter 220, a first pressure sensor 231, a second pressure sensor 232, a first control unit 240, a second control unit 150, first to fifth pipes P21 to P25, a sixth pipe P6, a first valve V1, second to fifth valves V22 to V25, and a sixth valve V6.

The first tube phragm 210 is disposed inside the pump 200. The photoresist PR is stored inside the first tube phragm 210. An outer wall of the first tube phragm 210 is made of a flexible material. The tube phragm drive unit 215 is connected to the first tube phragm 210. The tube phragm drive unit 215 applies pressure to the outer wall of the first tube phragm 210 to reduce the interior volume of the first tube phragm 210. As a result, the photoresist PR stored inside the first tube phragm 210 is discharged out of the first tube phragm 210. The tube phragm drive unit 215 is controlled by the first control unit 240.

The filter 220 is disposed inside the pump 200. The filter 220 filters particles and bubbles present in the photoresist PR. The first pipe P21 is connected between the pump 200 and the nozzle 12. For example, the first pipe P21 connects one end of the filter 220 and the nozzle 12. The photoresist PR flows from the filter 220 through the first pipe P21 to the nozzle 12. The first valve V1 is installed in the first pipe P21. The first valve V1 adjusts the amount of the photoresist PR flowing into the first pipe P21.

The second pipe P22 is connected between one end of the first tube phragm 210 and the other end of the filter 220. A second valve V22 is installed in the second pipe P22. The second valve V22 adjusts the amount of the photoresist PR flowing into the second pipe P22. The third pipe P23 is connected to the other end of the first tube phragm 210. A third valve V23 is installed in the third pipe P23. The third valve V23 adjusts the amount of the photoresist PR flowing into the third pipe P23.

A fourth pipe P24 is connected to the filter 220. The fourth pipe P24 extends out from the pump 200. The fourth pipe P24 functions as a drain pipe. The fourth valve V24 is installed in the fourth pipe P24. The fourth valve V24 adjusts the amount of the photoresist PR flowing into the fourth pipe P24. A fifth pipe P25 is connected between the first pipe P21 and the third pipe P23. The fifth valve V25 is installed in the fifth pipe P25. The fifth valve V25 adjusts the amount of the photoresist PR flowing into the fifth pipe P25. A sixth pipe P6 is connected to each of the third pipe P23 and the fifth pipe P25. The sixth pipe P6 is connected to the second tube phragm 160.

The first pressure sensor 231 is disposed in the first pipe P21. For example, the first pressure sensor 231 is disposed between one end of the filter 120 and the first valve V1. The first pressure sensor 231 measures the first pressure of the first pipe P21. The first control unit 240 acquires information about the first pressure of the first pipe P21 from the first pressure sensor 231.

The second pressure sensor 232 is disposed in the second pipe P22. For example, the second pressure sensor 232 is disposed between one end of the first tube phragm 210 and the second valve V22. The second pressure sensor 232 measures the second pressure of the second pipe P22. The first control unit 240 acquires information about the second pressure of the second pipe P22 from the second pressure sensor 232.

The first control unit 240 acquires information on the first pressure of the first pipe P21 from the first pressure sensor 231 and information on the second pressure of the second pipe P22 from the second pressure sensor 232. The first control unit 240 controls the tube phragm drive unit 215 using the information about the first pressure and the information about the second pressure.

The first control unit 240 controls the first tube phragm 210 to transfer the photoresist PR stored therein to the filter 220, using the tube phragm drive unit 215. In this case, the first control unit 240 controls the filter 220 to discharge the particles and bubbles present inside out from the pump 200 through the fourth pipe P24, using the photoresist PR transferred to the filter 220. A detailed explanation thereof will be provided below.

The first control unit 240 controls the first tube phragm 210 to transfer the photoresist PR through the first pipe P21 using the information about the first pressure received from the first pressure sensor 231 to increase the internal pressure of the first pipe P21. The first control unit 240 maintains the internal pressure of the first pipe P21 at a constant value through such an operation. A detailed explanation thereof will be provided below.

Hereinafter, a method for operating a photoresist supplying system according to some embodiments of the present disclosure will be described referring to FIGS. 12 to 18.

Figure 12:
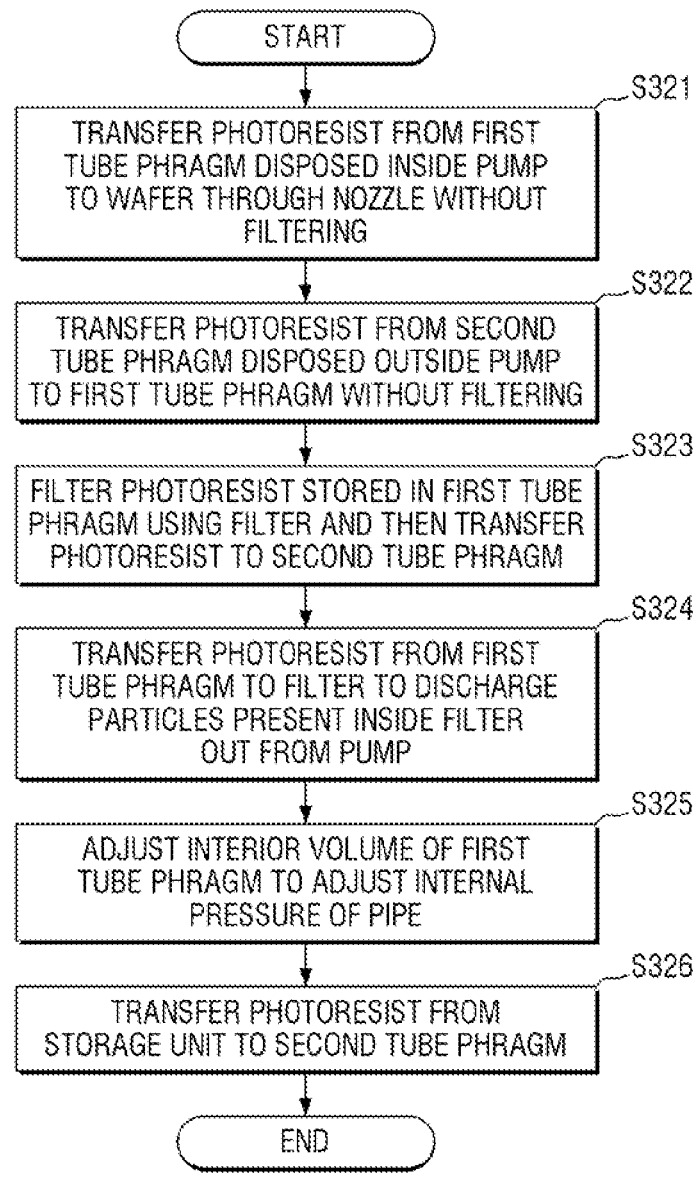
FIG. 12 is a flowchart of a method for operating a photoresist supplying system according to some embodiments of the present disclosure.

FIG. 12 is a flowchart of a method for operating a photoresist supplying system according to some embodiments of the present disclosure. FIG. 12 is a detailed flowchart of step S120 of providing the photoresist PR to the top of the wafer W shown in FIG. 12. FIGS. 13 to 18 illustrate a method for operating a photoresist supplying system according to some embodiments of the present disclosure.

Figure 13:
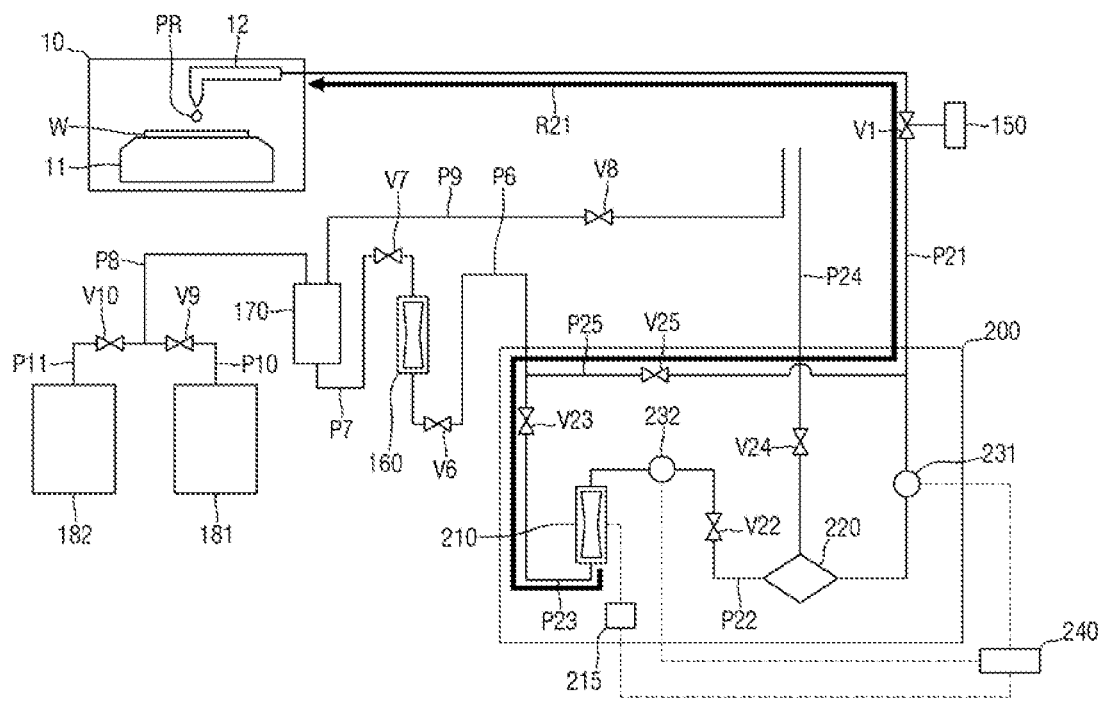
FIGS. 13 to 18 illustrate a method for operating a photoresist supplying system according to some embodiments of the present disclosure.

Referring to FIGS. 12 and 13, in an embodiment, in step S321, the photoresist PR stored in the first tube phragm 210 is discharged onto the wafer W through the nozzle 12 without filtering.

Specifically, when each of the first valve V1, the third valve V23, and the fifth valve V25 is opened, and each of the second valve V22, the fourth valve V24, and the sixth valve V6 is closed, the photoresist PR stored in the first tube phragm 210 sequentially flows through the third pipe P23, the fifth pipe P25, and the first pipe P21 along the first route R21 to the nozzle 12. The first route R21 does not pass through the filter 220.

Figure 14:
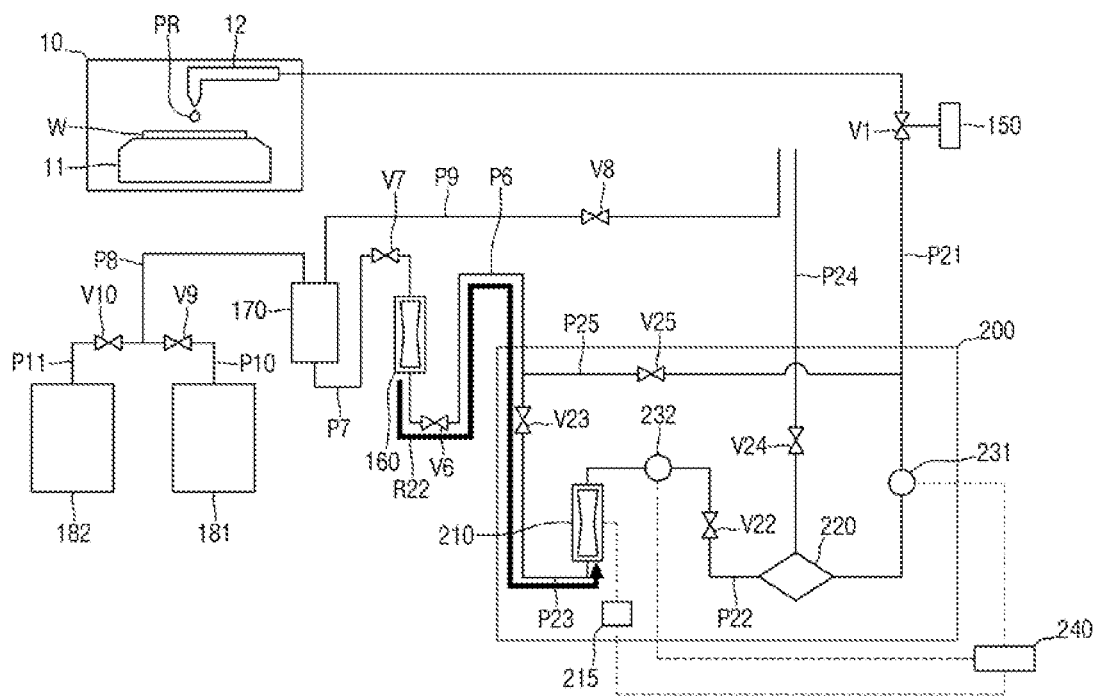

Referring to FIGS. 12 and 14, in an embodiment, in step S322, the photoresist PR stored in the second tube phragm 160 flows to the first tube phragm 210 without filtering.

Specifically, when each of the third valve V23 and the sixth valve V6 is opened, and each of the first valve V1, the second valve V22, the fourth valve V24, the fifth valve V25, and the seventeenth valve V7 is closed, the photoresist PR stored in the second tube phragm 160 sequentially flows through the sixth pipe P6 and the third pipe P23 along the second route R22 to the first tube phragm 210.

Figure 15:
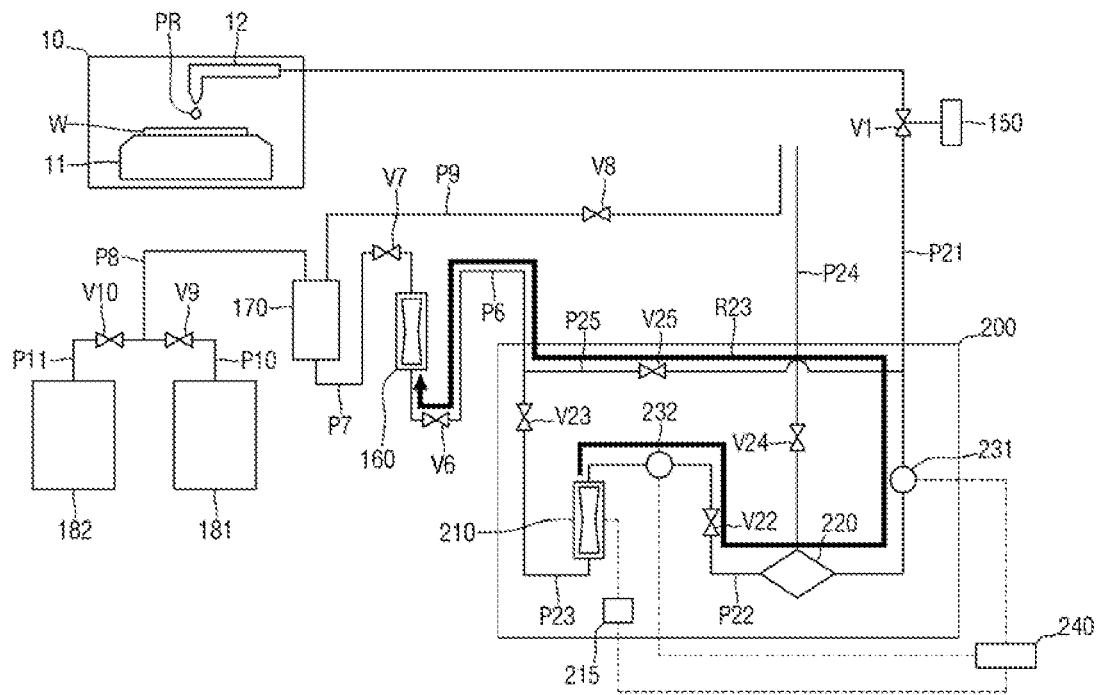

Referring to FIGS. 12 and 15, in an embodiment, in step S323, at least a part of the photoresist PR stored in the first tube phragm 210 is filtered using the filter 220 and then flows to the second tube phragm 160. For example, a recirculation operation is performed that transfers at least a part of the photoresist PR stored in the first tube phragm 210 to the second tube phragm 160.

Specifically, when each of the second valve V22, the fifth valve V25, and the sixth valve V6 is opened, and each of the first valve V1, the third valve V23, and the fourth valve V24 is closed, the photoresist PR stored in the first tube phragm 210 sequentially flows through the second pipe P22, the first pipe P21, the fifth pipe P25, and the sixth pipe P6 along the third route R23 to the second tube phragm 160.

Figure 16:
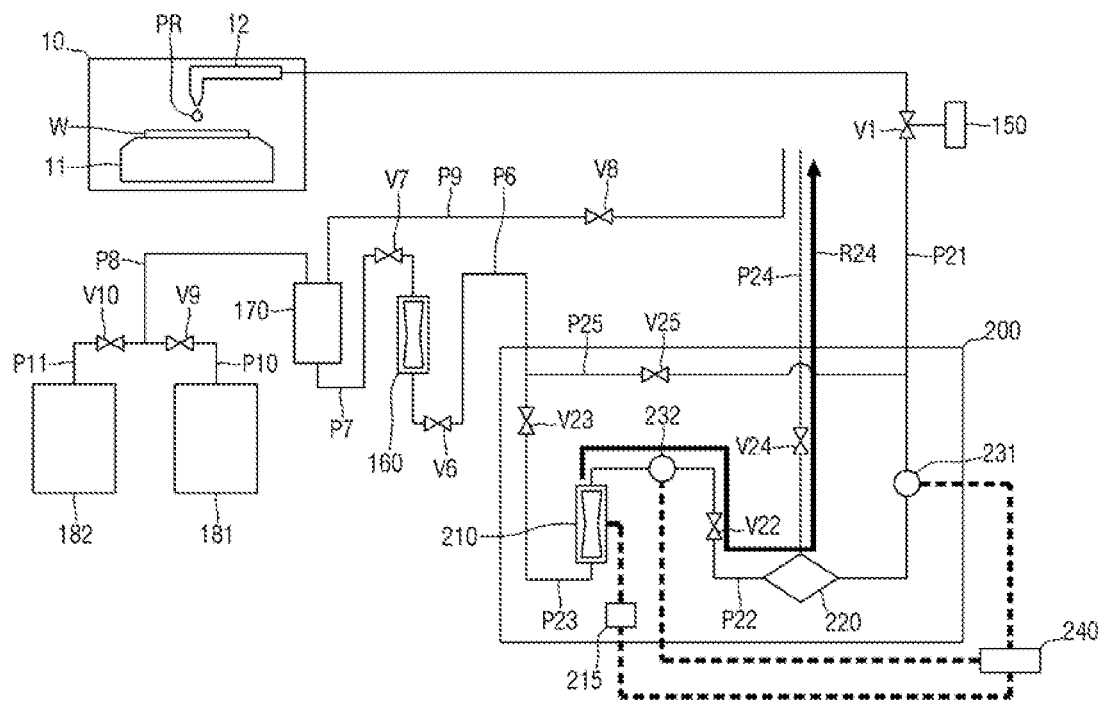

Referring to FIGS. 12 and 16, in an embodiment, in step S324, the photoresist PR stored in the first tube phragm 210 flows to the filter 220, and particles and bubbles present inside the filter 220 are discharged out from the pump 200.

Specifically, when each of the second valve V22 and the fourth valve V24 is opened, and each of the first valve V1, the third valve V23, the fifth valve V25, and the sixth valve V6 is closed, the photoresist PR stored in the first tube phragm 210 sequentially flows through the second pipe P22 and the fourth pipe P24 along the fourth route R24 out from the pump 200. In this case, the photoresist PR is discharged out from the pump 200, together with particles and bubbles present inside the filter 220.

The first control unit 240 acquires information on the first pressure of the first pipe P21 from the first pressure sensor 231 and information on the second pressure of the second pipe P22 from the second pressure sensor 232. When a differential pressure between the first pressure and the second pressure reaches a preset differential pressure, the first control unit 240 controls the tube phragm drive unit 215 to transfer the photoresist PR from the first tube phragm 210 to the filter 220. The photoresist PR transferred to the filter 220 is discharged out from the pump 200, together with particles and bubbles present inside the filter 220.

Figure 17:
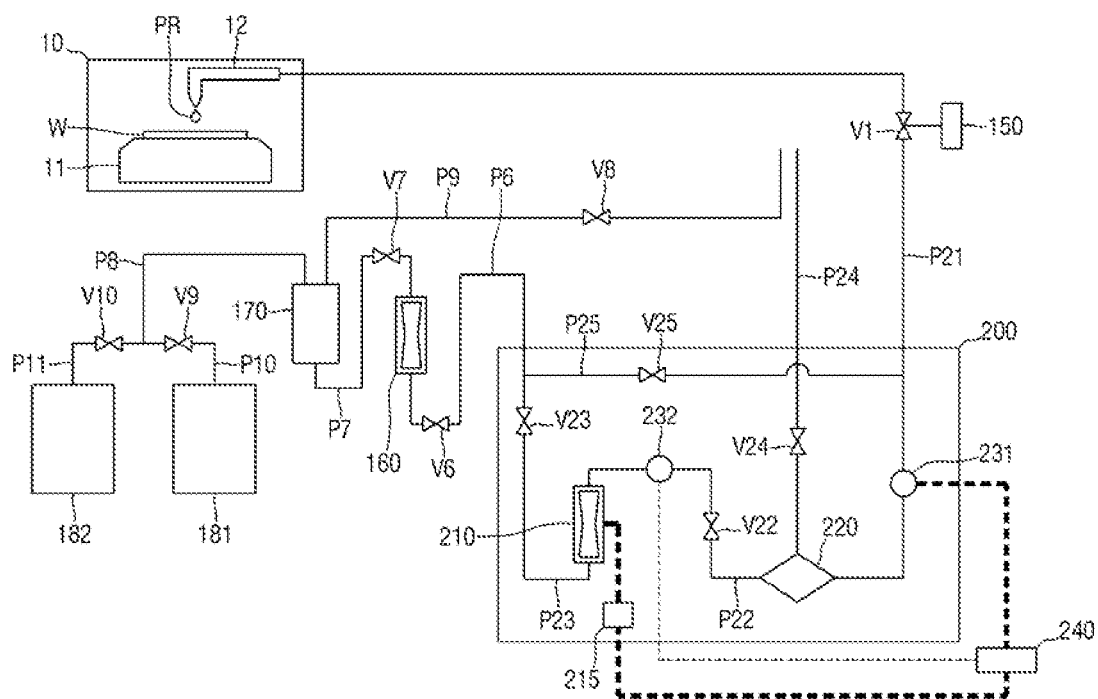

Referring to FIGS. 12 and 17, in an embodiment, in step S325, the interior volume of the first tube phragm 210 is adjusted to adjust the pressure of the first pipe P21.

Specifically, when the first pressure of the first pipe P21 drops below a preset pressure, the first control unit 240 controls the tube phragm drive unit 215 to transfer the photoresist PR from the first tube phragm 210 to the first pipe P21. Accordingly, the internal pressure of the first pipe P21 is increased, and the first pressure in the first pipe P21 is maintained higher than the preset pressure.

Figure 18:
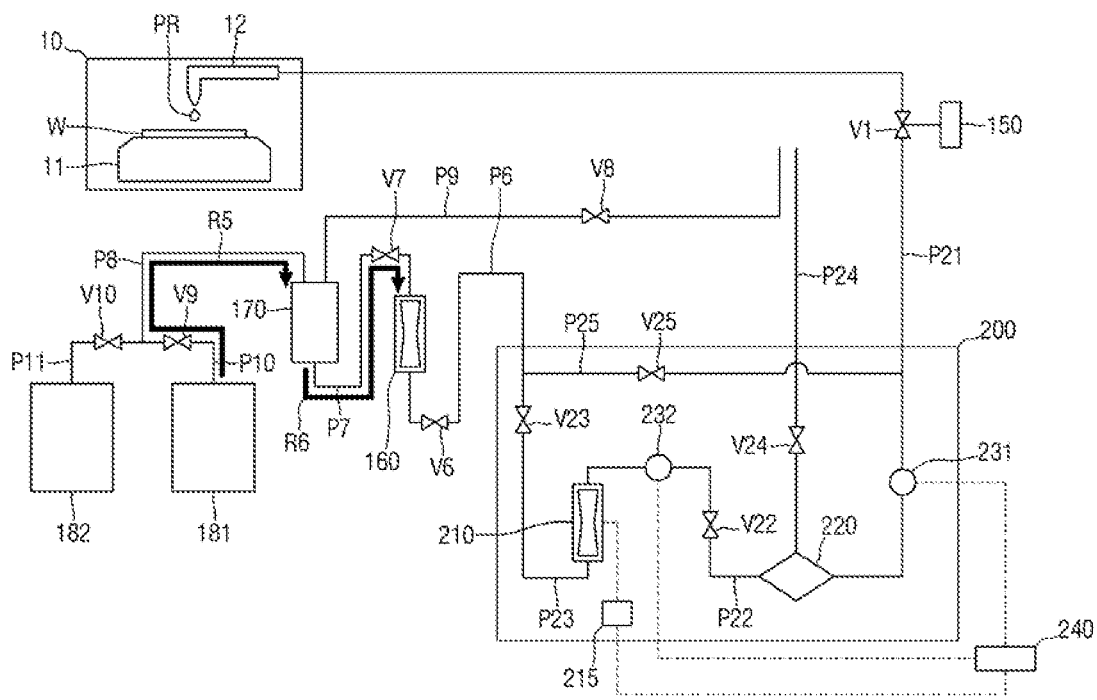

Referring to FIGS. 12 and 18, in an embodiment, in step S326, the photoresist PR stored in the first storage unit 181 or the second storage unit 182 is transferred to the second tube phragm 160 (S326).

For example, when the photoresist PR stored in the first storage unit 181 is transferred to the second tube phragm 160, when each of the seventh valve V7 and the ninth valve V9 is opened, and each of the sixth valve V6, the eighth valve V8 and the tenth valve V10 is closed, the photoresist PR stored in the first storage unit 181 sequentially flows through the tenth pipe P10 and the eighth pipe P8 along the fifth route R5 to the auxiliary storage unit 170. The photoresist PR stored in the auxiliary storage unit 170 flows through the seventh pipe P7 along the sixth route R6 to the second tube phragm 160.

After the photoresist PR stored in the first storage unit 181 is transferred to the second tube phragm 160, the eighth valve V8 is selectively opened, and air present in the auxiliary storage unit 170 is discharged out from the auxiliary storage unit 170 through the ninth pipe P9.

A photoresist supplying system according to some embodiments of the present disclosure transfers the photoresist PR to the nozzle 12, by repeatedly performing the steps S321 to S326 shown in FIG. 12.

Hereinafter, a method for operating a photoresist supplying system according to some embodiments of the present disclosure will be described referring to FIGS. 19 and 20. Differences from a method for operating a photoresist supplying system shown in FIGS. 12 to 18 will be mainly described.

Figure 19:
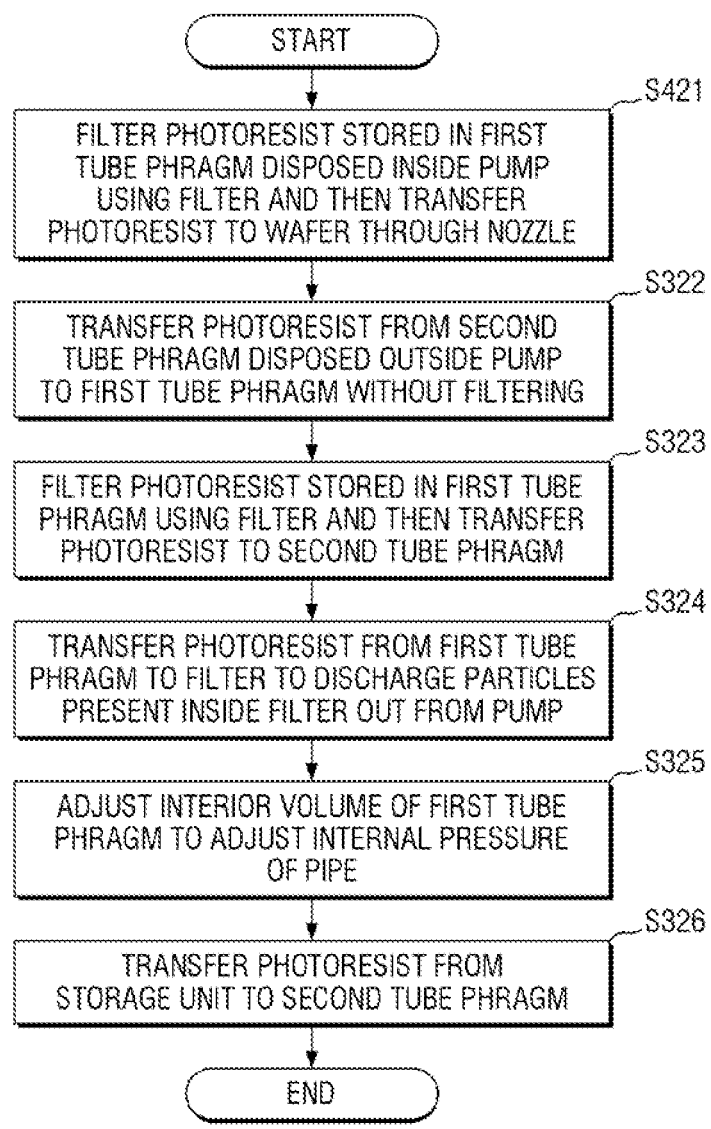
FIG. 19 is a flowchart of a method for operating a photoresist supplying system according to some embodiments of the present disclosure.

FIG. 19 is a flowchart of a method of operating a photoresist supplying system according to some embodiments of the present disclosure. FIG. 19 is a detailed flowchart of step S120 of providing the photoresist PR to the top of the wafer W shown in FIG. 11. FIG. 20 illustrates a method of operating a photoresist supplying system according to some embodiments of the present disclosure.

Figure 20:
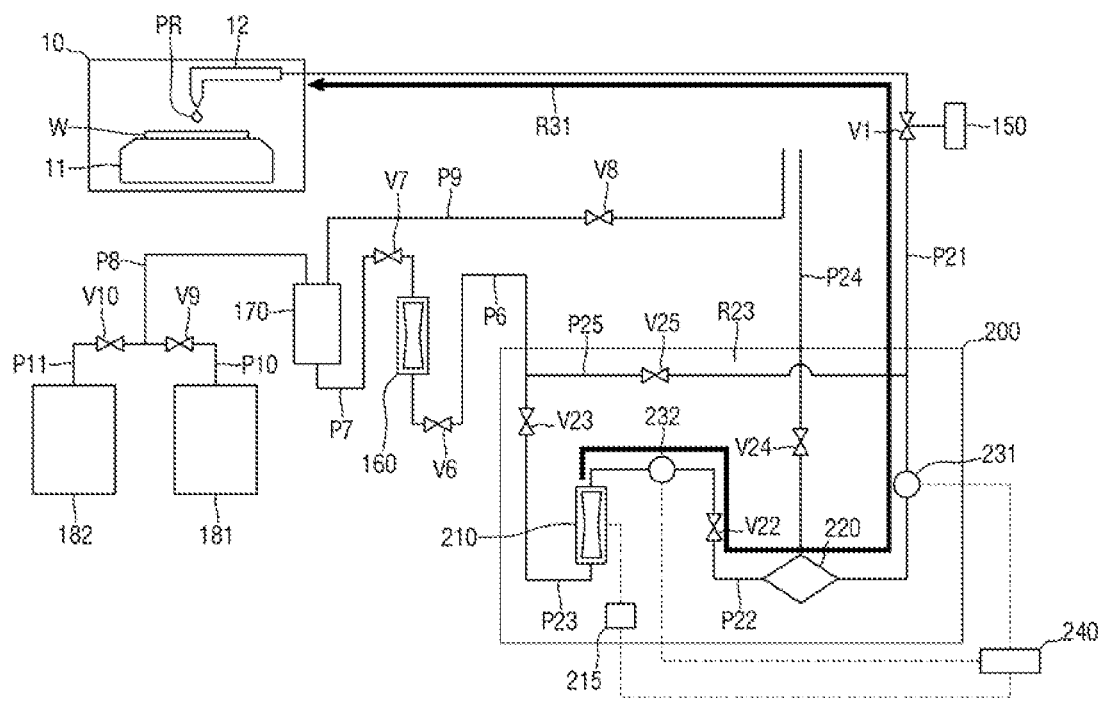
FIG. 20 illustrates a method for operating a photoresist supplying system according to some embodiments of the present disclosure.

Referring to FIGS. 19 and 20, in a method of operating a photoresist supplying system according to some embodiments of the present disclosure, in step 421, the photoresist PR stored in the first tube phragm 210 is filtered using the filter 220, and is discharged to the wafer W through the nozzle 12.

Specifically, when each of the first valve V1 and the second valve V22 is opened and each of the third to sixth valves V23, V24, V25, and V6 is closed, the photoresist PR stored in the first tube phragm 210 sequentially flows through the second pipe P22, the filter 220, and the first pipe P21 along the first route R31 to the nozzle 12. The photoresist PR is filtered by flowing through the filter 220.

Hereinafter, a pump unit that includes a plurality of pumps of a photoresist supplying system according to some embodiments of the present disclosure will be described referring to FIG. 21.

Figure 21:
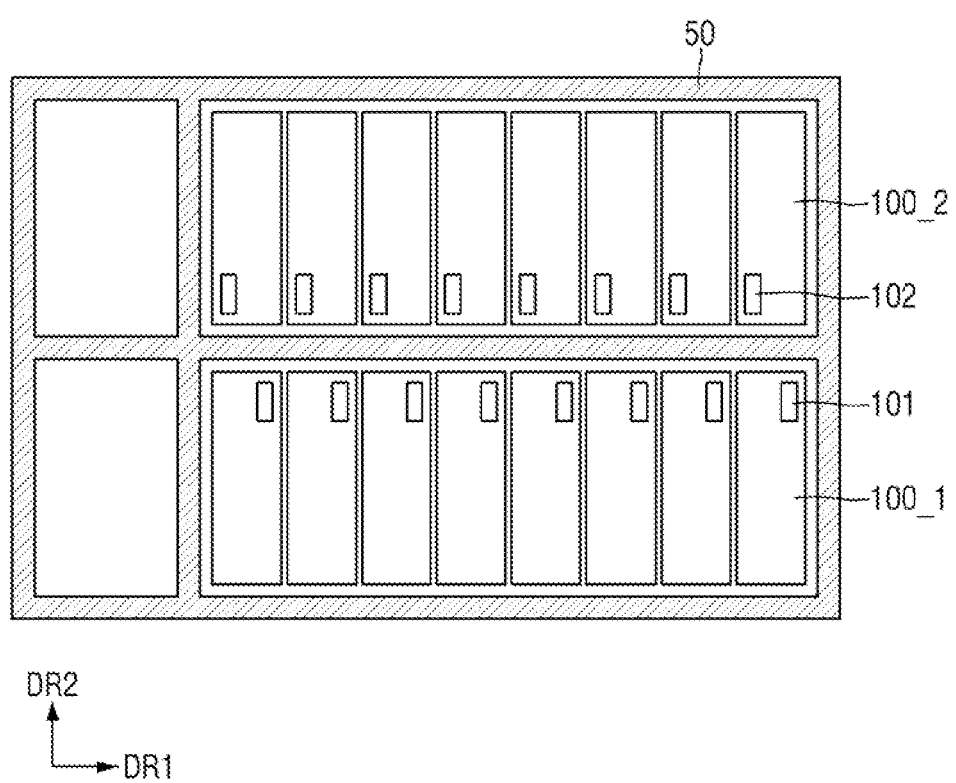
FIG. 21 is a plan view of a pump unit in which a plurality of pumps of a photoresist supplying system according to some embodiments of the present disclosure are installed.

FIG. 21 is a plan view of a pump unit that includes a plurality of pumps of a photoresist supplying system according to some embodiments of the present disclosure.

Referring to FIG. 21, a plurality of pumps (100 of FIG. 1) of a photoresist supplying system according to some embodiments of the present disclosure are disposed inside the frame 50.

For example, a plurality of first pumps 100_1 are disposed apart from each other in a first direction DR1. A plurality of second pumps 100_2 are disposed apart from each other in the first direction DR1. The plurality of second pumps 100_1 are spaced apart from the plurality of first pumps 100_1 in a second direction DR2 perpendicular to the first direction DR1.

For example, the plurality of second pumps 100_1 are aligned with the plurality of first pumps 100_1 in the second direction DR2. However, embodiments of the present disclosure are not necessarily limited thereto. In some embodiments, the plurality of second pumps 100_2 are not aligned with the plurality of first pumps 100_1 in the second direction DR2.

A first cable connection unit 101 is disposed in each of the plurality of first pumps 100_1. In a plan view, the first cable connection unit 101 is disposed at a right upper part of each of the plurality of first pumps 100_1. The first cable connection unit 101 is a portion to which a cable that drives each of the plurality of first pumps 100_1 is connected.

A second cable connection unit 102 is disposed in each of the plurality of second pumps 100_2. in a plan view, the second cable connection unit 102 are disposed at a left lower part of each of the plurality of second pumps 100_2. The second cable connection unit 102 is a portion to which a cable that drives each of the plurality of second pumps 100_2 is connected.

The second cable connection unit 102 does not overlap the first cable connection unit 101 in the second direction DR2, which increases the efficiency of the space usage in which the cables connected to each of the first cable connection unit 101 and the second cable connection unit 102 are disposed.

In concluding the detailed description, those skilled in the art will appreciate that many variations and modifications may be made to embodiments without substantially departing from the principles of the present disclosure. Therefore, embodiments of the disclosure are used in a generic and descriptive sense only and not for purposes of limitation.

What is claimed is:

1. A system for supplying a photoresist, comprising:
    a pump that includes a first tube phragm that stores the photoresist and a filter that filters the photoresist;
    a second tube phragm that stores the photoresist, wherein the second tube phragm is disposed outside the pump and provides the photoresist to the first tube phragm;
    a storage unit that stores the photoresist and provides the photoresist to the second tube phragm; and
    a tube phragm drive unit that is connected to the first tube phragm,
    wherein the tube phragm drive unit adjusts an interior volume of the first tube phragm and applies a pressure to a flexible outer wall of the first tube phragm wherein the photoresist is transferred from the first tube phragm to a nozzle installed in a chamber,
    at least a part of the photoresist stored in the first tube phragm is transferred to the second tube phragm, and
    wherein before the photoresist is provided to the nozzle, the interior of the first tube phragm is repeatedly expanded and contracted wherein the photoresist inside a pipe connected to the nozzle is prevented from staying at a same position.

2. The system for supplying photoresist of claim 1, further comprising:
    a first pipe that is connected between the first tube phragm and the nozzle;
    a second pipe that is connected between the first tube phragm and one end of the filter;
    a third pipe that is connected to an other end of the filter;
    a fourth pipe that is connected to the filter and extends out from the pump;
    a fifth pipe that is connected between the second pipe and the third pipe; and
    a sixth pipe that is connected between the third pipe and the second tube phragm.

3. The system for supplying photoresist of claim 2, further comprising:
    a first pressure sensor disposed in the second pipe and that measures a pressure of the second pipe;
    a second pressure sensor disposed in the third pipe and that measures a pressure of the third pipe; and
    a control unit that acquires information about a first pressure of the second pipe from the first pressure sensor and information about a second pressure of the third pipe from the second pressure sensor, wherein the control unit controls the tube phragm drive unit using the information about the first pressure and the information about the second pressure.

4. The system for supplying photoresist of claim 3, wherein when a differential pressure between the first pressure and the second pressure reaches a preset differential pressure, the control unit controls the tube phragm drive unit wherein the photoresist is transferred from the first tube phragm to the filter, and the control unit discharges particles and bubbles present inside the filter out from the pump through the fourth pipe using the photoresist received from the first tube phragm.

5. The system for supplying photoresist of claim 4, wherein after the particles and bubbles present inside the filter are discharged out from the pump through the fourth pipe and the differential pressure is maintained at or above the preset differential pressure, the filter is replaced.

6. The system for supplying photoresist of claim 3, wherein when the first pressure drops below a preset pressure, the control unit controls the tube phragm drive unit wherein the photoresist stored in the first tube phragm is transferred to the second pipe, and the control unit increases an internal pressure of the second pipe.

7. The system for supplying photoresist of claim 1, wherein transferring the photoresist from the first tube phragm to the nozzle includes:
    a first step of transferring the photoresist from the first tube phragm to the nozzle without filtering;
    a second step of filtering the photoresist stored in the second tube phragm using the filter and transferring the photoresist to the first tube phragm;
    a third step of transferring the photoresist from the first tube phragm to the second tube phragm without filtering;
    a fourth step of transferring the photoresist from the first tube phragm to the filter wherein particles and bubbles present inside the filter are discharged out from the pump;
    a fifth step of adjusting an interior volume of the first tube phragm wherein an internal pressure of a pipe is adjusted; and
    a sixth step of transferring the photoresist from the storage unit to the second tube phragm,
    wherein the first to sixth steps are repeatedly performed wherein the photoresist is transferred to the nozzle.

8. The system for supplying photoresist of claim 7, wherein transferring the photoresist from the first tube phragm to the nozzle further includes
    a seventh step of determining whether a preset number of filtering instances is reached after completion of the third step,
    wherein when the number of filtering instances reaches the preset number of filtering instances, the fourth step is performed, and
    when the number of filtering instances does not reach the preset number of filtering instances, the second and third steps are repeatedly performed.

9. The system for supplying photoresist of claim 1, further comprising:
    a first pipe that is connected between the filter and the nozzle;
    a second pipe that is connected between one end of the first tube phragm and the filter;

a third pipe that is connected to an other end of the first tube phragm;

a fourth pipe that is connected to the filter and extends out from the pump;

a fifth pipe that is connected between the first pipe and the third pipe; and a sixth pipe that is connected between the third pipe and the second tube phragm.

10. The system for supplying photoresist of claim 9, further comprising:

a first pressure sensor disposed in the first pipe and that measures a pressure of the first pipe;

a second pressure sensor disposed in the second pipe and that measures a pressure of the second pipe; and a control unit that acquires information about a first pressure of the first pipe from the first pressure sensor and information about a second pressure of the second pipe from the second pressure sensor, wherein the control unit controls the tube phragm drive unit using the information about the first pressure and the information about the second pressure.

11. The system for supplying photoresist of claim 10, wherein when a differential pressure between the first pressure and the second pressure reaches a preset differential pressure, the control unit controls the tube phragm drive unit wherein the photoresist stored in the first tube phragm is transferred to the filter, and the control unit discharges particles and bubbles present inside the filter out from the pump through the fourth pipe by using the photoresist received from the first tube phragm.

12. The system for supplying photoresist of claim 1, wherein transferring the photoresist from the first tube phragm to the nozzle includes:

a first step of transferring the photoresist from the first tube phragm to the nozzle without filtering;

a second step of transferring the photoresist from the second tube phragm to the first tube phragm without filtering;

a third step of filtering the photoresist stored in the first tube phragm using the filter and transferring the photoresist to the second tube phragm;

a fourth step of transferring the photoresist from the first tube phragm to the filter wherein particles and bubbles present inside the filter are discharged out from the pump;

a fifth step of adjusting an interior volume of the first tube phragm wherein an internal pressure of a pipe is adjusted; and a sixth step of transferring the photoresist from the storage unit to the second tube phragm, wherein the first to sixth steps are repeatedly performed wherein the photoresist is transferred to the nozzle.

13. The system for supplying photoresist of claim 1, wherein transferring the photoresist from the first tube phragm to the nozzle includes:

a first step of filtering the photoresist stored in the first tube phragm using the filter and transferring the photoresist to the nozzle;

a second step of transferring the photoresist from the second tube phragm to the first tube phragm without filtering;

a third step of filtering the photoresist stored in the first tube phragm using the filter and transferring the photoresist to the second tube phragm;

a fourth step of transferring the photoresist from the first tube phragm to the filter wherein particles and bubbles present inside the filter are discharged out from the pump;

a fifth step of adjusting an interior volume of the first tube phragm wherein an internal pressure of a pipe is adjusted; and a sixth step of transferring the photoresist from the storage unit to the second tube phragm, wherein the first to sixth steps are repeatedly performed wherein the photoresist is transferred to the nozzle.

14. A system for supplying a photoresist, comprising:

a pump that includes a first tube phragm that stores the photoresist and a filter that filters the photoresist;

a second tube phragm that stores the photoresist, wherein the second tube phragm is disposed outside the pump and transfers the photoresist to the first tube phragm;

a storage unit that stores the photoresist and provides the photoresist to the second tube phragm;

a tube phragm drive unit that is connected to the first tube phragm, wherein the tube phragm drive unit adjusts an interior volume of the first tube phragm;

a first pipe that is connected to one end of the filter;

a second pipe that is connected to an other end of the filter;

a third pipe that is connected to the filter and extends out from the pump;

a first pressure sensor disposed in the first pipe;

a second pressure sensor disposed in the second pipe; and a control unit which acquires information about a first pressure of the first pipe from the first pressure sensor and information about a second pressure of the second pipe from the second pressure sensor, wherein the control unit controls the tube phragm drive unit using the information about the first pressure and the information about the second pressure, wherein when a differential pressure between the first pressure and the second pressure reaches a preset differential pressure, the control unit controls the tube phragm drive unit and the photoresist is transferred from the first tube phragm to the filter, and the control unit discharges particles and bubbles present inside the filter out from the pump through the third pipe using the photoresist received from the first tube phragm.

15. A system for supplying a photoresist, comprising:

a pump that includes a first tube phragm that stores the photoresist and a filter that filters the photoresist;

a second tube phragm that stores the photoresist, wherein the second tube phragm is disposed outside the pump and provides the photoresist to the first tube phragm; and a storage unit that stores the photoresist and provides the photoresist to the second tube phragm, wherein the photoresist is transferred from the first tube phragm to a nozzle installed in a chamber, wherein at least a part of the photoresist stored in the first tube phragm is transferred to the second tube phragm, wherein transferring the photoresist from the first tube phragm to the nozzle includes:

a first step of transferring the photoresist from the first tube phragm to the nozzle without filtering, a second step of filtering the photoresist stored in the second tube phragm using the filter and transferring the photoresist to the first tube phragm, a third step of transferring the photoresist from the first tube phragm to the second tube phragm without filtering, a fourth step of transferring the photoresist from the first tube phragm to the filter wherein particles and bubbles present inside the filter are discharged out from the pump, a fifth step of adjusting an interior volume of the first tube phragm wherein an internal pressure of a pipe is adjusted, and a sixth step of transferring the photoresist from the storage unit to the second tube phragm, and wherein the first to sixth steps are repeatedly performed wherein the photoresist is transferred to the nozzle, and wherein before the photoresist is provided to the nozzle, the interior of the first tube phragm is repeatedly expanded and contracted wherein the photoresist inside a pipe connected to the nozzle is prevented from staying at a same position.

16. The system for supplying photoresist of claim 15, further comprising a tube phragm drive unit that is connected to the first tube phragm, wherein the tube phragm drive unit adjusts an interior volume of the first tube phragm and applies a pressure to a flexible outer wall of the first tube phragm wherein the photoresist is transferred from the first tube phragm to the nozzle.

17. The system for supplying photoresist of claim 15, wherein transferring the photoresist from the first tube phragm to the nozzle further includes a seventh step of determining whether a preset number of filtering instances is reached after completion of the third step, wherein when the number of filtering instances reaches the preset number of filtering instances, the fourth step is performed, and when the number of filtering instances does not reach the preset number of filtering instances, the second and third steps are repeatedly performed.

18. The system for supplying photoresist of claim 15, further comprising:

a first pipe that is connected between the first tube phragm and the nozzle;

a second pipe that is connected between the first tube phragm and one end of the filter;

a third pipe that is connected to an other end of the filter;

a fourth pipe that is connected to the filter and extends out from the pump;

a fifth pipe that is connected between the second pipe and the third pipe; and a sixth pipe that is connected between the third pipe and the second tube phragm.

* * * * *